United States Patent
Keane et al.

(10) Patent No.: US 8,537,955 B1
(45) Date of Patent: Sep. 17, 2013

(54) SYSTEM AND METHOD FOR COMPENSATING FOR LOOP FILTER DELAY

(75) Inventors: John Patrick Keane, San Francisco, CA (US); Günter Steinbach, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 406 days.

(21) Appl. No.: 12/891,996

(22) Filed: Sep. 28, 2010

(51) Int. Cl.
*H03D 3/24* (2006.01)

(52) U.S. Cl.
USPC .......................................... 375/376; 327/156

(58) Field of Classification Search
USPC .............. 375/376, 226, 327; 455/103, 127, 455/307, 325; 327/156–159; 331/1 A, 16–18, 331/23, 25
See application file for complete search history.

(56) References Cited

U.S. PATENT DOCUMENTS

| | | |
|---|---|---|
| 6,775,345 B1 | 8/2004 | Song |
| 6,927,611 B2 * | 8/2005 | Rhee et al. .................. 327/149 |
| 7,986,190 B1 * | 7/2011 | Lye ............................... 331/1 A |
| 2005/0258908 A1 * | 11/2005 | Mitric ............................ 331/16 |
| 2010/0208775 A1 * | 8/2010 | Weill ............................ 375/150 |

OTHER PUBLICATIONS

Fulvio Spagna, "An Improved Delay Compensation Technique for Digital Clock Recovery Loops", Electronics, Circuits and Systems 2001, ICECS 2001, pp. 1395-1398.

* cited by examiner

*Primary Examiner* — Khai Tran (57) ABSTRACT

A clock recovery circuit includes a phase detector, a loop filter, a phase rotator, a predictor and a delay line. The phase detector receives an input data signal and generates a phase error signal for estimating phase error in the input data signal when referred to a recovered clock. The loop filter receives the phase error signal and determines a phase control signal based on the phase error signal. The phase rotator receives the phase control signal, and provides a phase adjusted clock based on a reference clock and the phase control signal. The predictor receives the phase error signal, and determines a delay control signal based on the phase error signal. The delay line outputs the recovered clock by delaying the phase adjusted clock from the phase rotator using the delay control signal from the predictor, and provides the recovered clock to the phase detector.

19 Claims, 5 Drawing Sheets

SYSTEM AND METHOD FOR COMPENSATING FOR LOOP FILTER DELAY

BACKGROUND

Jitter is deviation of an actual timing edge from an ideal timing edge in a sequence of data that typically occurs at high frequencies. Jitter in a digital system is essentially a timing error that can affect timing allocation within a bit cell, for example. Jitter is typically measured at the differential zero crossings for balanced electrical signals, at the average voltage level for unbalanced signals, and at the average optical power level for optical signals. Jitter is often used as a figure of merit, and tracking jitter-induced errors over a period of time can provide an indication of system stability.

In clock recovery circuits, jitter compensation can be effected using a delay-locked loop (DLL). For example, a DLL-based clock-and-data recovery (CDR) circuit consists of a phase detector, a loop filter and a phase rotator. The objective of the DLL is to make the phase of a recovered clock track jitter on an input data signal. Generally, the phase detector generates a phase error signal, indicating a phase difference between an input data signal and the recovered clock. The loop filter uses the phase error signal to update a phase control signal with the goal of aligning a recovered clock with the input data signal. The phase rotator receives the phase control signal and the reference clock, and adjusts the phase of the reference clock using the phase control signal to generate the recovered clock. The recovered clock is provided to the phase detector for comparison with the input data signal, completing the cycle.

In a digital implementation, for example, the loop filter may be implemented using a digital signal processor (DSP), which includes at least a digital integrator for a first-order DLL. In conventional systems, the DSP operates at a much lower frequency than the phase detector for ease of implementation. Operation at the lower frequency may result in undesired and substantial latency in the DLL. The latency is generally manifest in a lapse between the determination of the phase error by the phase detector and the phase shift provided by the phase rotator.

Due to this latency in the DLL, the frequency-domain observed jitter transfer function (OJTF), which is essentially the phase transfer function from the input data signal to the phase error signal, may exhibit peaking. At high jitter frequencies (e.g., jitter in the input data signal having a frequency of about one percent of the data frequency and above), the phase difference between the input data signal and the recovered clock signal may be amplified. As such, and especially at higher frequency operation, the DLL actually amplifies rather than suppresses jitter of certain frequencies.

SUMMARY

In a representative embodiment, a clock recovery circuit includes a phase detector, a loop filter, a phase rotator, a predictor and a delay line. The phase detector is configured to receive an input data signal and to generate a phase error signal for estimating phase error in the input data signal when referred to a recovered clock. The loop filter is configured to receive the phase error signal from the phase detector, and to determine a phase control signal based on the phase error signal. The phase rotator is configured to receive the phase control signal from the loop filter, and to provide a phase adjusted clock based on a reference clock and the phase control signal. The predictor is configured to receive the phase error signal from the phase detector, and to determine a delay control signal based on the phase error signal. The delay line is configured to output the recovered clock by delaying the phase adjusted clock from the phase rotator using the delay control signal from the predictor, and to provide the recovered clock to the phase detector.

In another representative embodiment, a clock recovery circuit includes a phase detector, a loop filter, a clock generator, a predictor and a delay line. The phase detector is configured to generate a phase error signal estimating phase error in an input data signal. The loop filter is configured to determine a control signal based on the phase error signal from the phase detector. The clock generator is configured to provide a preliminary recovered clock based on the control signal from the loop filter. The predictor is configured to determine a delay control signal based on the phase error signal from the phase detector. The delay line is configured to provide a recovered clock by delaying the preliminary recovered clock from the clock generator by a delay amount indicated by the delay control signal from the predictor, and to provide the recovered clock to the phase detector.

In another representative embodiment, a method is provided for recovering a clock to compensate for jitter in an input data signal. The method includes generating a phase error signal at a phase detector for estimating phase error in the input data signal when referred to a recovered clock; determining a phase control signal based on the phase error signal; and generating a phase adjusted clock from a reference clock; using the phase control signal. A delay control signal is determined based on the phase error signal, the delay control signal predicting a future effect on the phase control signal resulting from the phase error signal. The phase of the phase adjusted clock is adjusted based on the determined delay control signal to provide the recovered clock, and the recovered clock is provided to the phase detector for generating another phase error signal. The recovered clock is substantially aligned with the input data signal.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features and/or components.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

In view of this disclosure it is noted that the various CDR circuits may be implemented in variant structures and using variant components in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

According to various embodiments, the CDR architecture includes a delay line connected in series with a phase rotator in a delay-locked loop (DLL) implementation. The delay line is controlled by a predictor, based on a detected phase error in an input data signal, to adjust the delay of a phase adjusted clock output by the phase rotator to output a recovered clock. The recovered clock is input to a phase detector to compensate immediately for the phase error based on the anticipated effect of that phase error. Thus, the predictor essentially predicts a future change in the phase rotator input due to the current phase error. Similarly, in a phase-lock loop (PLL) implementation, the CDR architecture includes a delay line connected in series with a voltage controlled oscillator (VCO) or digitally controlled oscillator (DCO) in order to adjust the delay of the recovered clock.

Figure 1:
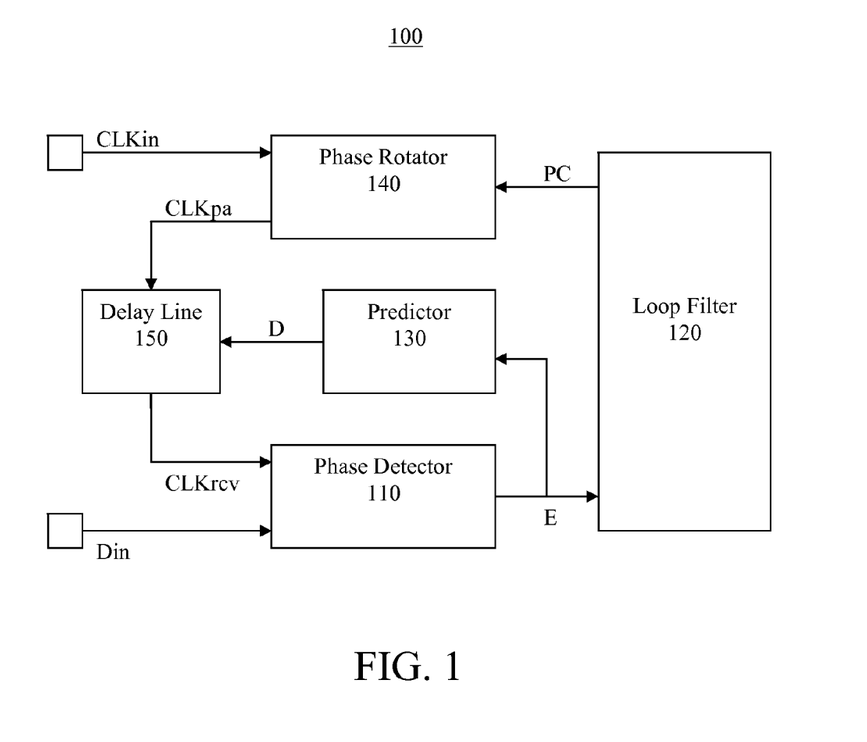
FIG. 1 is a simplified block diagram of a CDR circuit, in accordance with a representative embodiment.

FIG. 1 is a simplified block diagram of a CDR circuit in accordance with a representative embodiment.

Referring to FIG. 1, CDR circuit 100 is a DLL implementation that includes phase detector 110, loop filter 120 and phase rotator 140. The phase detector 110 is configured to receive input data signal Din and recovered clock CLKrcv, and to measure a difference in phase between the input data signal Din and recovered clock CLKrcv. In a digital implementation, the phase error estimate is a digital signal. The input data signal may include data from a device under test (DUT), for example, where the data is being measured or otherwise analyzed. Generally, the recovered clock CLKrcv is a reference clock CLKin adjusted for phase error, such as jitter, in the input data signal Din, discussed below. The phase detector 110 outputs phase error signal E, which is a phase error estimate indicating the detected phase difference between the input data signal Din and recovered clock CLKrcv.

The loop filter 120 receives the phase error signal E from the phase detector 110 and determines a phase control signal PC based on the phase error signal E. In an illustrative embodiment, the loop filter 120 includes a digital integrator, an example of which is discussed below with reference to FIG. 3. The loop filter 120 thus integrates the phase error signal E with previously received phase error signals to produce the phase control signal PC. The loop filter 120 outputs the phase control signal PC to the phase rotator 140.

The phase rotator 140 is an example of a clock generator that provides a preliminary recovered clock, such as the phase adjusted clock CLKpa, based on a phase control signal PC from the loop filter 120 and the reference clock CLKin. Another example of a clock generator is a VCO or a DCO, as indicated by representative oscillator 440 discussed below with reference to FIG. 4, which provides a frequency adjusted clock CLKfa as a preliminary recovered clock based on a frequency control signal FC. The phase rotator 140 and the oscillator 440 are examples of clock generators in DLL-based and PLL-based CDR circuits, respectively.

Referring again to FIG. 1, the phase rotator 140 is configured to receive the phase control signal PC and the reference clock CLKin, and to output phase adjusted clock CLKpa. More particularly, the phase rotator 140 generates the phase adjusted clock CLKpa from the reference clock CLKin by shifting the phase of the reference clock CLKin in an amount corresponding to the phase control signal PC. This phase shift has a range of one period of the reference clock CLKin. Since cycles can be slipped by switching from the end to the start of this range of phase shift, an essentially unlimited effective phase shift can be implemented by the phase rotator 140.

The CDR circuit 100 further includes predictor 130 and delay line 150. Generally, the delay line 150 is controlled by the predictor 130, which generates delay control signal D based, at least in part, on the phase error signal E output by the phase detector 110. In various embodiments, the predictor 130 is implemented as an integrator, examples of which are discussed below with reference to FIGS. 2 and 3, which provides a scaled sum of the phase error signal E and previously received error signals in order to generate delay signal D. The predictor 130 has much smaller latency than the loop filter 120. For example, the predictor 130 may have a latency of about 5 clock cycles of the reference clock CLKin, while the loop filter 120 may have a latency of about 100 clock cycles of the reference clock CLKin, although the latencies may vary without departing from the scope of the present teachings.

The delay line 150 receives the phase adjusted clock CLKpa from the phase rotator 140 and the delay signal D from the predictor 130. The delay line 150 is configured to generate the recovered clock CLKrcv by delaying the phase adjusted clock CLKpa by a delay amount indicated by the delay control signal D, and to output the recovered clock CLKrcv to the phase detector 110. The phase detector 110 then begins repeating the cycle, using the recovered clock CLKrcv to measure the phase difference with the input data signal Din, as discussed above. The delay line 150 has limited delay range as compared to the phase rotator 140, which has essentially unlimited effective delay range due to its ability to slip cycles. The delay control signal D output by the predictor 130 effectively predicts a future change or phase shift in the phase control signal PC input to the phase rotator 140, e.g., due to current phase error (indicated by phase error signal E). The predictor 130 therefore immediately applies a delay corresponding to the predicted phase shift, by controlling the amount of delay provided by the delay line 150 via the delay control signal D, rather than waiting for the latency of the loop filter 120.

Effectively, the predictor 130 applies a delay prediction transfer function that provides delay control signal D in response to phase error signals E, at least in part, output by the phase detector 110. From the point of view of the delay prediction transfer function, according to various embodiments, the predictor 130 is a moving-average filter that produces a delay control signal D that is a scaled sum of the last M minus N phase error signals E, where M is a first delay (or first latency) introduced by the loop filter 120, and where N is a second delay (or second latency) introduced by the predictor 130. Both the first delay M and the second delay N are measured in clock cycles of the reference clock CLKin. The inclusion of the predictor 130 and the delay line 150 thus compensates for the latency of the loop filter 120, resulting in an OJTF that no longer exhibits peaking at certain jitter frequencies, particularly at high jitter frequencies.

Figure 2:
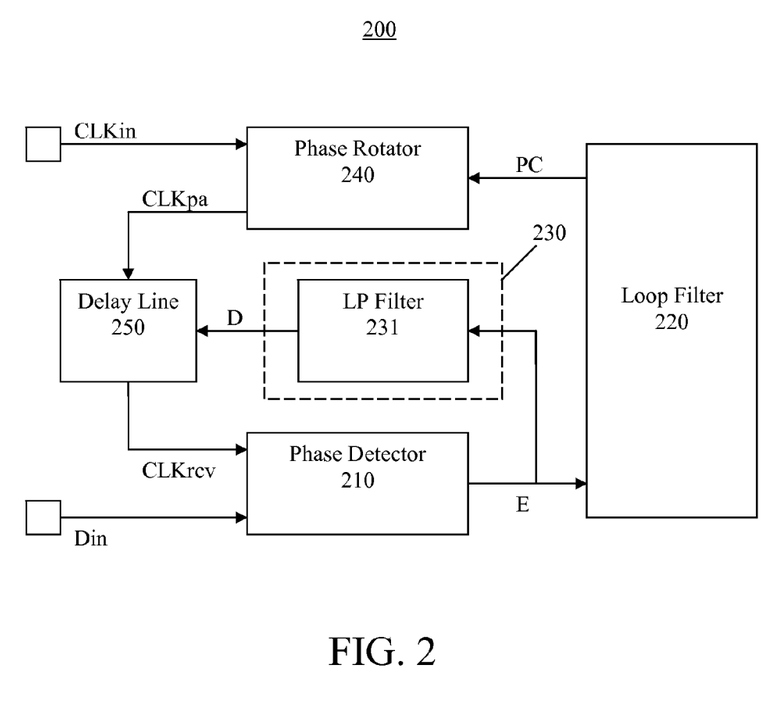
FIG. 2 is a simplified block diagram of a CDR circuit, in accordance with a representative embodiment.

In various embodiments, the predictor 130 may be implemented as various types of integrator, without departing from the scope of the present teachings. For example, FIG. 2 is a simplified block diagram of CDR circuit 200, in accordance with a representative embodiment, in which predictor 230 is implemented using low-pass filter 231. The low-pass filter 231 may be a simple, analog low-pass which outputs the delay control signal D in analog form. The corner frequency or cut-off frequency of the low-pass filter 231 is selected such that the low-pass filter 231 approximates the delay prediction transfer function of a moving-average filter, as discussed above. For example, a corner frequency of about 50 MHz may be selected for a data rate of about 10 GHz. The phase detector 210, the loop filter 220, the phase rotator 240 and the delay line 250 may be substantially the same as the phase detector 110, the loop filter 120, the phase rotator 140 and the delay line 150, respectively, as discussed above with reference to FIG. 1, and thus the corresponding descriptions will not be repeated.

In an alternative embodiment, the predictor 230 may be implemented using a band-pass filter (not shown) instead of the low-pass filter 231, without departing from the scope of the present teachings. The band-pass filter would have the same frequency-domain transfer characteristic as the (equivalent) low-pass filter 231 at all frequencies except very low frequencies (approaching DC). At very low frequencies, the gain of the band-pass filter would go to zero, while the low-pass filter 231 would go a fixed non-zero value. However, this would have no practical effect on the performance of the CDR circuit 200 because, at very low frequencies, the gain through the loop filter 220 is so high that it dominates the gain through the predictor 230. Therefore, it make little difference to the overall loop characteristic of the loop filter 220 whether the gain of the predictor 230 is zero (i.e., implementing a band-pass filter) or non-zero (implementing a low-pass filter) at very low frequencies.

Figure 3:
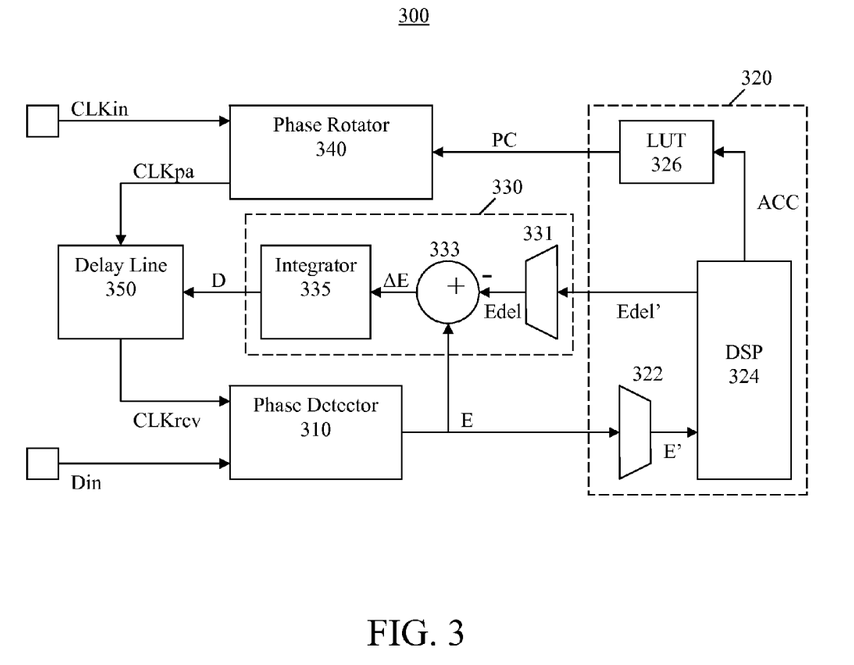
FIG. 3 is a simplified block diagram of a CDR circuit, in accordance with a representative embodiment.

Another example of a predictor is shown in FIG. 3, which is a simplified block diagram of CDR circuit 300, in accordance with a representative embodiment.

Referring to FIG. 3, CDR circuit 300 is a DLL implementation that includes phase detector 310, loop filter 320, predictor 330, phase rotator 340 and delay line 350. As discussed above, the phase detector 310 measures a difference in phase between input data signal Din and recovered clock CLKrcv, and outputs corresponding phase error signal E, which is a phase error estimate indicating the detected phase difference between the input data signal Din and recovered clock CLKrcv. The loop filter 320 receives the phase error signal E from the phase detector 310 and determines a phase control signal PC based on the phase error signal E.

In the depicted embodiment, the loop filter 320 includes demultiplexer 322, DSP 324 and a look-up table (LUT) 326. The demultiplexer 322 slows the phase error signal E to a clock rate suitable for use by the DSP 324. More particularly, the demultiplexer 322 receives the phase error signal E at a first (high) clock rate corresponding to the phase detector 310 and outputs low-speed phase error signal E' at a second (low) clock rate corresponding to the DSP 324. The DSP 324 implements the digital integrator of the loop filter 320, and provides an accumulated phase error signal ACC based on the low-speed phase error signal E' and at least one previous low-speed phase error signal E' (from a corresponding previous phase error signal E). The DSP 324 outputs the accumulated phase error signal ACC to the LUT 326, which is used to linearize the phase rotator 340. That is, the LUT 326 identifies the phase control signal PC associated with the accumulated phase error signal ACC from the DSP 324, where the identified phase control signal PC causes the phase rotator 340 to provide a phase adjusted clock CLKpa with a phase that is a substantially linear function of the accumulated phase error signal ACC. The DSP 324 and the LUT 326 add latency to the loop filter 320, thus contributing to the first delay of the loop filter 320, as discussed above with respect to the loop filter 120.

In various implementations, the DSP 324 may be replaced with other types of integrators without departing from the scope of the present teachings. Likewise, the LUT 326 may be replaced with other storage/processing means for calculating and/or matching phase control signals PC with accumulated phase error signals ACC, such as a relational database, for example, without departing from the scope of the present teachings. Memory for storing such information may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, and the like.

The DSP 324 also includes a delay path (not shown) configured to delay the low-speed phase error signal E' by a delay amount equal to at least a portion of the first delay M of the loop filter 320, e.g., introduced by at least the DSP 324 and the LUT 326. The delay path may include one or more flip-flops, for example, although other means of delaying the low-speed phase error signal E' may be implemented. Using the delay path, the DSP 324 is able provide a delayed low-speed phase error signal Edel', which is the same as the low-speed phase error signal E' delayed by the first delay. The delayed low-speed phase error signal Edel' thus compensates for at least a portion of the first delay M of the loop filter 320 minus the second delay N of the predictor.

The delayed low-speed phase error signal Edel' is output to the predictor 330. In the depicted representative embodiment, the predictor 330 includes multiplexer 331, subtractor (or adder) 333, and integrator 335. The multiplexer 331 is configured to receive the delayed low-speed phase error signal Edel' at the second clock rate corresponding to the DSP 324, and to output a delayed phase error signal Edel at the first clock rate corresponding to the phase detector 310. In the process, the multiplexer 331 delays the delayed phase error signal Edel in the amount corresponding to the remainder of the first delay M of the loop filter minus the second delay N of the predictor, such that the delayed phase error signal Edel output by the multiplexer 331 has an overall delay of M minus N clock cycles of the reference clock CLKin.

The subtractor 333 receives the delayed phase error signal Edel from the multiplexer 331 and the current phase error signal E from the phase detector 310. The subtractor 333 is configured to calculate a phase error difference signal $\Delta E$ by subtracting the delayed phase error signal Edel from the current phase error signal E. The phase error difference signal $\Delta E$ is input to the integrator 335, which integrates the phase error difference signal $\Delta E$ with previously received phase error difference signals $\Delta E$ to determine the delay control signal D. The integrator 335 thus provides a scaled sum or moving average of the phase error difference signals $\Delta E$. In other words, the integrator 335 integrates the difference between the current phase error signal E and a previous phase error signal E that has been delayed M minus N clock cycles. The integrator 335 thus implements a moving average filter. In various embodiments, the integrator 335 may be implemented by any means providing an effective moving average filter, such as an average or low-pass filter (an example of which is discussed above with respect to low-pass filter 231), a band-pass filter having the same effective frequency-domain transfer characteristic as the low-pass filter at high frequencies, or a charge pump with a controlled amount of leakage, without departing from the scope of the present teachings.

Meanwhile, as discussed above, the phase rotator 340 receives the phase control signal PC from the LUT 326 and the reference clock CLKin, and generates phase adjusted clock CLKpa from the reference clock CLKin by shifting the phase of the reference clock CLKin in an amount corresponding to the phase control signal PC. The delay line 350 receives the phase adjusted clock CLKpa from the phase rotator 340 and the delay control signal D from the integrator 335, which effectively predicts a future change or phase shift in the phase control signal PC input to the phase rotator 340. The delay line 350 generates the recovered clock CLKrcv by delaying the phase adjusted clock CLKpa by a delay amount indicated by the delay control signal D, and outputs the recovered clock CLKrcv to the phase detector 310. The phase detector 310 begins repeating the cycle, using the recovered clock CLKrcv to measure the phase difference with the input data signal Din, as discussed above.

The various implementations described above with respect to DLL-based CDRs, may also apply to PLL-based CDRs, without departing from the scope of the present teachings. For example, FIG. 4 is a simplified block diagram of a PLL-based CDR circuit, in accordance with a representative embodiment.

Figure 4:
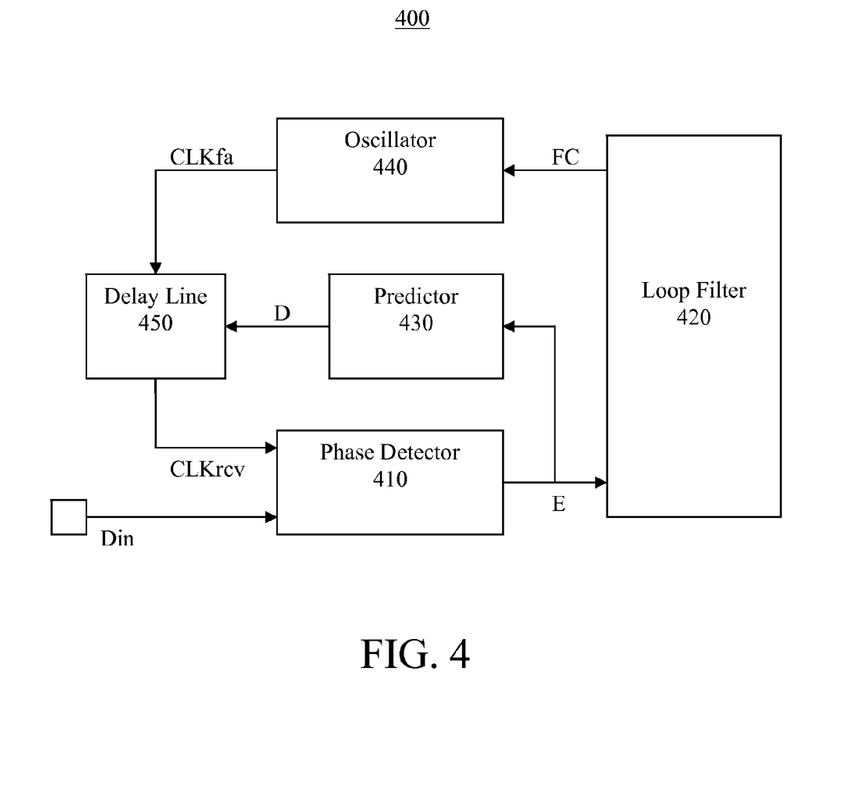
FIG. 4 is a simplified block diagram of a CDR circuit, in accordance with a representative embodiment.

Referring to FIG. 4, the CDR circuit 400 is a PLL implementation that includes phase detector 410, loop filter 420, predictor 430 and delay line 450. However, in place of a phase rotator, the CDR circuit 400 includes oscillator 440, which may be a VCO or a DCO, for example. As discussed above, the phase detector 410 measures a difference in phase between input data signal Din and recovered clock CLKrcv, and outputs corresponding phase error signal E, which is a phase error estimate indicating the detected phase difference between the input data signal Din and recovered clock CLKrcv. The loop filter 420 receives the phase error signal E from the phase detector 410 and determines a frequency control signal FC based on the phase error signal E.

The oscillator 440 receives the frequency control signal FC, which controls the frequency of the VCO or DCO, and generates a frequency adjusted clock CLKfa by adjusting its frequency of oscillation in an amount corresponding to the frequency control signal FC. Because phase is the integral of frequency, operation of the CDR circuit 400 is effectively equivalent to that of CDR circuit 100 in FIG. 1, except that the loop filter 420 contains one less integration of the phase error signal E than the loop filter 120, for example, in order to account for the additional integration function of the oscillator 440. Otherwise, the predictor 430 and the delay line 450 are substantially the same as the predictor 130 and the delay line 150, respectively, as discussed above with reference to FIG. 1, and thus the corresponding descriptions will not be repeated.

Figure 5:
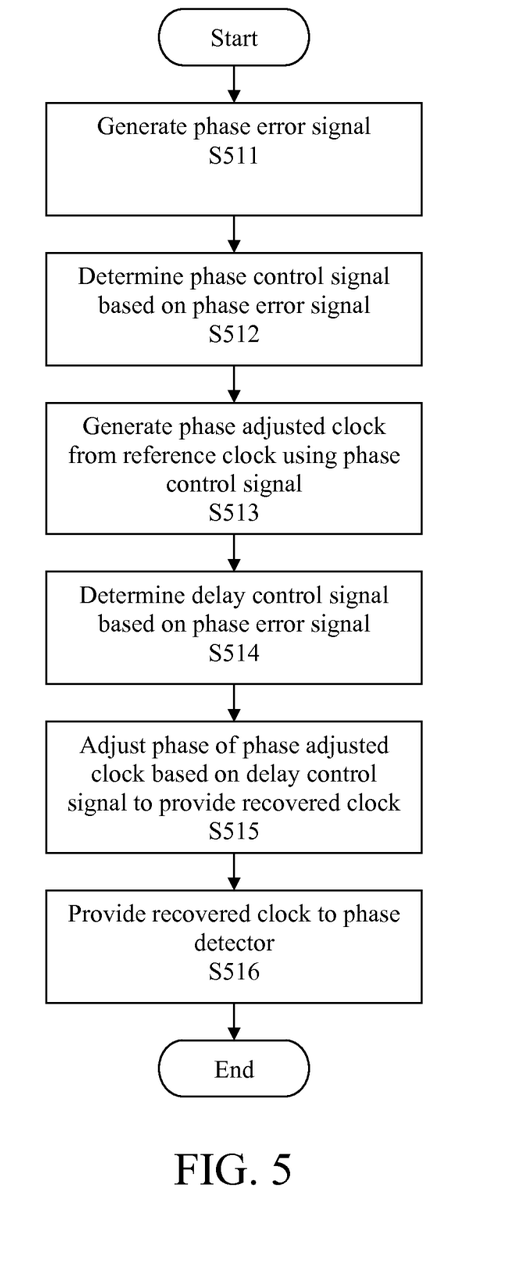
FIG. 5 is a flow diagram showing a method for providing a recovered clock in a CDR circuit, in accordance with a representative embodiment.

FIG. 5 is a flow diagram showing a method for providing a recovered clock in a CDR circuit, in accordance with a representative embodiment.

Referring to FIG. 5, a phase error signal E is generated by a phase detector, e.g., phase detector 110, in block S511. The phase error signal E estimates a phase error in the input data signal when referred to recovered clock CLKrcv. A phase control signal PC is determined, e.g., by loop filter 120, based on the phase error signal E at block S512, as discussed above. In block S513 a phase adjusted clock CLKpa is generated by a phase rotator, e.g., phase rotator 140, from a reference clock CLKin by shifting the phase of the reference clock CLKin in an amount corresponding to the phase control signal PC.

In block S514, a delay control signal D is determined by a predictor, e.g., predictor 130, based on the phase error signal E. Determining the delay control signal D may include approximating a moving average filter using the phase error signal E and at least one previously generated phase error signal, for example. The delay control signal D effectively predicts a future effect on the phase control signal PC resulting from the phase error signal E.

The phase of the phase adjusted clock is adjusted by a delay line, e.g., delay line 150, in block S515 based on the determined delay control signal D in order to provide the recovered clock CLKrcv. The recovered clock CLKrcv is provided to the phase detector for generating another phase error signal. The desired effect is for the recovered clock CLKrcv to be substantially aligned with the input data signal Din.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

The invention claimed is:

1. A clock recovery circuit, comprising:
   a phase detector configured to receive input data signal and to generate a phase error signal for estimating phase error in the input data signal when referred to a recovered clock;
   a loop filter configured to receive the phase error signal from the phase detector, and to determine a phase control signal based on the phase error signal;
   a phase rotator configured to receive the phase control signal from the loop filter, and to provide a phase adjusted clock based on a reference clock and the phase control signal;
   a predictor configured to receive the phase error signal from the phase detector, and to determine a delay control signal based on the phase error signal; and
   a delay line configured to output the recovered clock by delaying the phase adjusted clock from the phase rotator by a delay amount indicated by the delay control signal from the predictor, and to provide the recovered clock to the phase detector.

2. The clock recovery circuit of claim 1, wherein the phase detector is further configured to measure a difference in phase between the input data signal and the recovered clock, and to generate the phase error signal based on the measured difference.

3. The clock recovery circuit of claim 1, wherein the loop filter comprises:
   a digital signal processor (DSP) configured to generate an accumulated phase error signal based on the phase error signal and at least one previous phase error signal, wherein the phase control signal is identified using the accumulated phase error signal.

4. The clock recovery circuit of claim 3, wherein the loop filter further comprises:
   a demultiplexer configured to receive the phase error signal at a first clock rate corresponding to the phase detector and to output a low-speed phase error signal at a second clock rate corresponding to the DSP.

5. The dock recovery circuit of claim 4, wherein the DSP comprises a delay path configured to delay the low-speed phase error signal to provide a delayed low-speed phase error signal, which compensates for a delay introduced by at least the DSP.

6. The clock recovery circuit of claim 5, wherein the delay path comprises at least one flip-flop.

7. The clock recovery circuit of claim 5, wherein the predictor comprises:
a multiplexer configured to receive the delayed low-speed phase error signal at the second clock rate and to output a delayed phase error signal at the first clock rate; and
a subtractor configured to subtract the delayed phase error signal from a current phase error signal output by the phase detector and to output a phase error difference signal, wherein the phase error difference signal is used to determine the delay control signal.

8. The clock recovery circuit of claim 7, wherein the predictor further comprises:
a charge pump configured to output a scaled sum of the phase error difference signal as the delay control signal.

9. The clock recovery circuit of claim 7, wherein the predictor further comprises:
one of a low-pass filter or a band-pass filter configured to output the delay control signal using the phase error difference signal.

10. The clock recovery circuit of claim 4, wherein the predictor comprises:
one of a low-pass filter or a band-pass filter configured to output the delay control signal using the phase error signal.

11. The clock recovery circuit of claim 10, wherein the low-pass filter or band-pass filter has a corner frequency that enables the low-pass filter or band-pass filter to approximate a delay prediction transfer function of a moving average filter.

12. A clock recovery circuit, comprising:
a phase detector configured to generate a phase error signal estimating phase error in an input data signal;
a loop filter configured to determine a control signal based on the phase error signal from the phase detector;
a clock generator configured to provide a preliminary recovered clock based on the control signal from the loop filter;
a predictor configured to determine a delay control signal based on the phase error signal from the phase detector; and
a delay line configured to provide a recovered clock by delaying the preliminary recovered clock from the clock generator by a delay amount indicated by the delay control signal from the predictor, and to provide the recovered clock to the phase detector, wherein the predictor approximates a moving average filter.

13. The clock recovery circuit of claim 12, wherein the delay control signal comprises a scaled sum of a determined number of previous phase error signals from the phase detector, wherein the determined number is the difference in clock cycles of the reference clock between a first delay introduced by the loop filter and a second delay introduced by the predictor.

14. The clock recovery circuit of claim 13, wherein the predictor comprises:
a subtractor configured to calculate a phase error difference signal by subtracting a previous phase error signal from the current phase error signal; and
an integrator configured to output the delay control signal based on the phase error difference signal from the subtractor.

15. The clock recovery circuit of claim 13, wherein the predictor comprises one of a low-pass filter, a band-pass filter or a charge pump with a controlled amount of leakage configured to output the delay control signal based on the phase error signal from the phase detector.

16. The clock recovery circuit of claim wherein the clock generator comprises a phase rotator configured to adjust a phase of the reference clock to provide the preliminary recovered clock.

17. The clock recovery circuit of claim 12, wherein the clock generator comprises one of a voltage controlled oscillator (VCO) or a digitally controlled oscillator (DCO) configured to adjust its frequency of oscillation to provide the preliminary recovered clock.

18. A method of recovering a clock to compensate for jitter in an input data signal, the method comprising:
generating a phase error signal at a phase detector for estimating phase error in the input data signal when referred to a recovered clock;
determining a phase control signal based on the phase error signal;
generating a phase adjusted clock from a reference clock; using the phase control signal;
determining a delay control signal based on the phase error signal, the delay control signal predicting a future effect on the phase control signal resulting from the phase error signal; and
adjusting the phase of the phase adjusted clock based on the determined delay control signal to provide the recovered clock, and providing the recovered clock to the phase detector for generating another phase error signal, wherein the recovered clock is substantially aligned with the input data signal.

19. The method of claim 18, wherein determining the delay control signal comprises approximating a moving average filter using the phase error signal and at least one previously generated phase error signal.

* * * * *

UNITED STATES PATENT AND TRADEMARK OFFICE
CERTIFICATE OF CORRECTION

| | | |
|---|---|---|
| PATENT NO. | : 8,537,955 B1 | Page 1 of 1 |
| APPLICATION NO. | : 12/891996 | |
| DATED | : September 17, 2013 | |
| INVENTOR(S) | : John Patrick Keane et al. | |

It is certified that error appears in the above-identified patent and that said Letters Patent is hereby corrected as shown below:

In the Claims

In column 8, line 61, in claim 5, delete "dock" and insert -- clock --, therefor.

In column 10, line 17, in claim 16, delete "claim" and insert -- claim 12, --, therefor.

Signed and Sealed this
Tenth Day of December, 2013

Margaret A. Focarino
*Commissioner for Patents of the United States Patent and Trademark Office*